United States Patent [19]

Principi et al.

[11] 4,385,368

[45] May 24, 1983

[54] PROGRAMMABLE READ ONLY MEMORY

[75] Inventors: Fabio Principi, San Jose; Bruce G. Armstrong, Belmont, both of Calif.

[73] Assignee: Raytheon Company, Lexington, Mass.

[21] Appl. No.: 210,095

[22] Filed: Nov. 24, 1980

[51] Int. Cl.³ .............................................. G11C 17/06
[52] U.S. Cl. ........................................ 365/105; 365/96
[58] Field of Search .................... 365/105, 94, 103, 96

[56] References Cited

U.S. PATENT DOCUMENTS 4,130,889 12/1978 Chua .................................... 365/105

FOREIGN PATENT DOCUMENTS 19381 11/1980 European Pat. Off. .
1498741 1/1978 United Kingdom .

Primary Examiner—Terrell W. Fears
Attorney, Agent, or Firm—Richard M. Sharkansky; Joseph D. Pannone

[57] ABSTRACT

A programmable read-only memory (PROM) circuit is provided wherein each one of a plurality of fusible links is coupled between a different row and column conductor of a matrix of row and column conductors and wherein each one of the row conductors is coupled to a corresponding one of a plurality of row driver circuits, each one having an output transistor connected to the corresponding one of the row conductors. Switch means are provided for feeding a first level of base current to the output transistors during the programming mode and for feeding a second, lower level of base current to such output transistors during the read mode.

6 Claims, 1 Drawing Figure

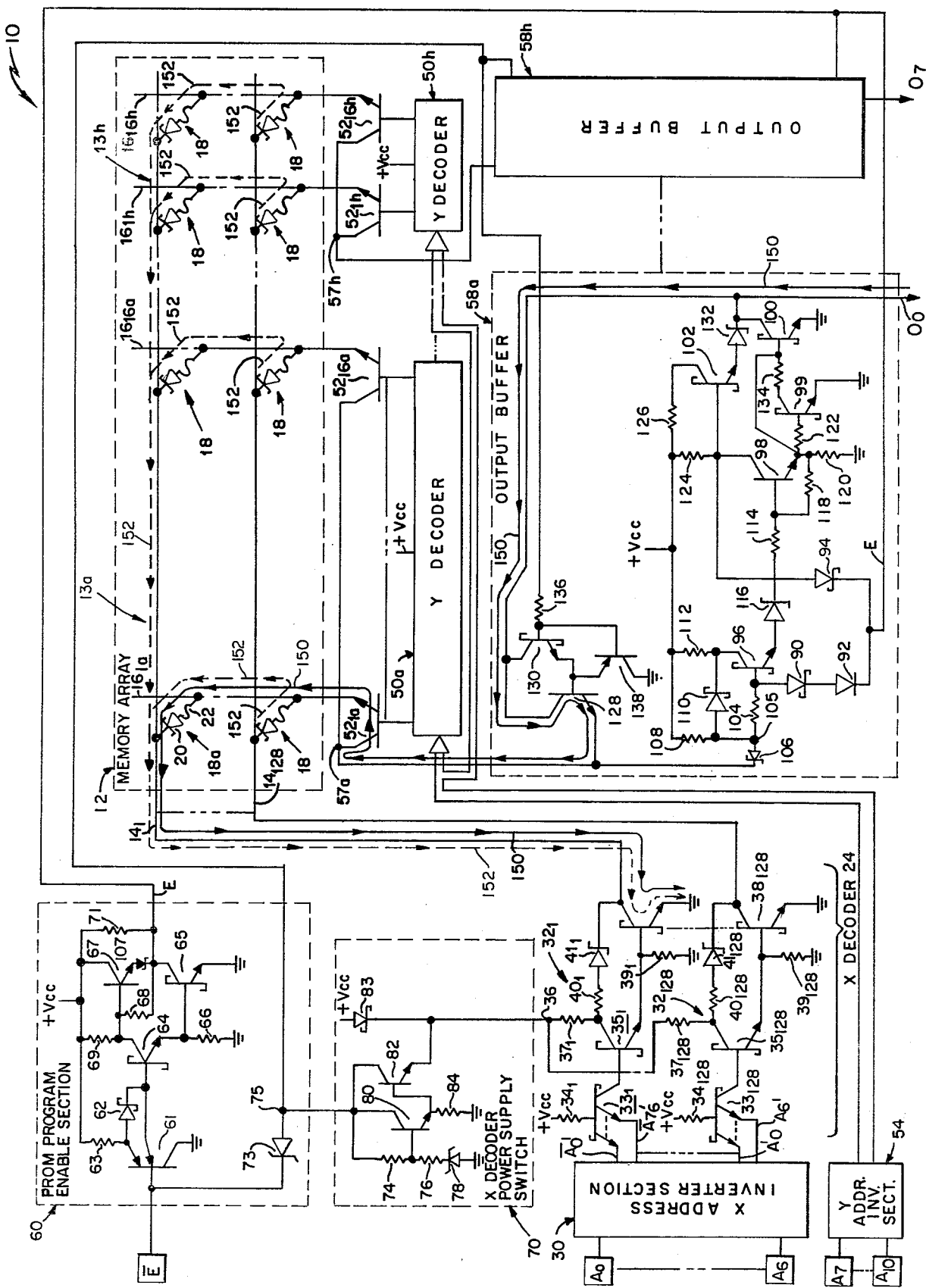

PROGRAMMABLE READ ONLY MEMORY

BACKGROUND OF THE INVENTION

This invention relates generally to programmable read-only memory (PROM) circuitry and, more particularly, to PROM circuitry having relatively large memory capacity.

As is known in the art, PROM circuits have a wide range of applications in digital computation and processing systems. As is also known in the art, such PROM circuits are typically formed as a single semiconductor integrated circuit chip. In bipolar PROM circuits, a matrix of rows and columns of conductors have memory elements connected between a unique row conductor-column conductor combination. Each one of the memory elements typically includes a diode and serially connected fusible link. During programming, selected ones of the fusible links are blown, creating an open circuit between the previously electrically connected row conductor and column conductor connected to such blown fusible link. The resulting pattern of blown and unblown fusible links represents data stored in the PROM. More particularly, a blown fusible link at a "location" defined by the unique row conductor-column conductor previously connected to such blown fusible link may represent a logical 0 signal stored at such location; whereas an unblown fusible link at a second address defined by a different row conductor-column conductor combination may represent a logical 1 signal stored at such second address.

More specifically, in the bipolar PROM circuit referred to above, each one of the row conductors is coupled to a corresponding row driver circiut. Each one of such row driver circuits includes an output transistor having a collector electrode connected to the row conductor coupled to such row driver circuit and an emitter electrode connected to a fixed potential, typically ground. When it is desired to fuse one of the fusible links coupled to a particular row conductor, base current is supplied to the one of the output transistors having its collector electrode connected to it to drive such transistor into saturation. Current is supplied to the one of the column conductors connected to the fusible link desired to be blown. Such current then flows through the selected fusible link, through the collector-emitter electrodes of the saturated output transistor to ground. Typically, the amount of current required to blow the fusible link is in the order of 25 milliamperes (ma). It is noted that, during the selection of one of the fusible links, the fusible links connected to the unselected row conductors have the diodes serially connected thereto reverse biased by a relatively high voltage produced at the collector electrodes of the output transistors of the unselected row driver circuits. While such voltage reverse biases these diodes, leakage current (typically 1.5 microampere per diode) does pass through such diodes and through the selected, saturated output transistor to ground potential. While in PROM circuits having a relatively small number of memory elements, typically less than 8 K, such leakage current is insignificant, in PROM circuits having, say, 16 K memory elements, the total leakage current passing through the saturated output transistor is in the same order of magnitude as the current needed to fuse or blow the selected fusible link. Therefore, the amount of current which such output transistor must sink is significantly increased as the memory capacity of the PROM is increased. One way to provide an output transistor which is able to sink this additional current is to increase the area required to form such transistor; however, such approach has the concomitant effect of reducing the amount of available area on the surface of the semiconductor chip.

SUMMARY OF THE INVENTION

In accordance with the present invention, a programmable read-only memory (PROM) circuit is provided wherein each one of a plurality of fusible links is coupled between a different row and column conductor of a matrix of row and column conductors and wherein each one of the row conductors is coupled to a corresponding one of a plurality of row driver circuits, each one having an output transistor connected to the corresponding one of the row conductors. Switch means are provided for feeding a first level of base current to the output transistors during the programming mode and for feeding a second lower level of base current to such output transistors during the read mode.

With such arrangement, the output transistors have decreased forced beta and are thereby able to sink both current required to blow a fusible link and additional leakage current passing through diodes serially connected to unselected fusible links during the program mode.

BRIEF DESCRIPTION OF THE DRAWINGS

The foregoing aspects and other features of the invention are explained in more detail in the following description taken in conjunction with the accompanying drawing which shows a schematic diagram of a programmable read-only memory (PROM) circuit according to the invention.

DESCRIPTION OF THE PREFERRED EMBODIMENT

Referring now to the single FIGURE, a programmable read-only memory (PROM) circuit 10, here a 16 K PROM, is shown to include a memory array 12, here arranged to store 16,384 bits of information arranged as 2048 eight-bit digital words. The memory array 12 thus has eight sections $13a-13h$, each one of such sections $13a-13h$ being arranged to store a different one of the eight bits of the 2048 digital words. Thus, while each one of the sections $13a-13h$ includes row conductors $14_1-14_{128}$, sections $13a$ through $13h$ include column conductors $16_{1a}-16_{16a}$ through $16_{1h}-16_{16h}$, respectively, as indicated. Each one of a plurality of, here 16,384, memory elements 18 is coupled between a unique one of the row conductors $14_1-14_{128}$ and column conductors $16_{1a}-16_{16h}$, as indicated, the memory element labeled $18a$ being shown connected between row conductor $14_1$ and column conductor $16_{1a}$. Each one of the memory elements 18 includes a diode 20, here a Schottky diode, and a serially connected fusible link 22, as shown.

An X decoder section 24 is connected to the row conductors $14_1-14_{128}$, as shown, such X decoder section 24 being coupled to terminals $A_0-A_6$ through conventional X address inverter section 30. As will be described in detail hereinafter, terminals $A_0-A_6$ are fed by 7 bits of an 11-bit address word, the remaining four bits of such address word being fed to terminals $A_7-A_{10}$. Suffice it to say here, however, that the logic signals fed to terminals $A_0-A_6$ provide seven bits of the eleven bits used to address the 2048 words stored in the PROM 10.

As mentioned, the X address inverter section 30 is of any conventional design and, in response to the logic signals $A_0$–$A_6$ fed respectively to terminals $A_0$–$A_6$ produces true signals $A_0'$–$A_6'$ and complementary signals $\overline{A}_0'$–$\overline{A}_6'$ respectively on lines $\overline{A}_0'$–$\overline{A}_6'$. The signals on lines $A_0'$–$A_6'$ and $\overline{A}_0'$–$\overline{A}_6'$ are fed to the X decoder section 24 as shown.

The X decoder section 24 includes a plurality of, here 128, row driver circuits $32_1$–$32_{128}$, as shown. Each one of such row driver circuits $32_1$–$32_{128}$ includes an input transistor $33_1$–$33_{128}$ having base electrodes coupled to a $+V_{cc}$ supply, here $+5$ volts, through resistors $34_1$–$34_{128}$, respectively, as indicated. The seven emitter electrodes of each one of the input Schottky transistors $33_1$–$33_{128}$ are coupled to selected ones of the lines $A_0'$–$A_6'$ and $\overline{A}_0'$–$\overline{A}_6'$ in a conventional manner; here lines $\overline{A}_0'$–$\overline{A}_6'$ are coupled to the seven emitter electrodes of transistor $33_1$ and lines $A_0'$–$A_6'$ are coupled to the seven emitter electrodes of transistor $33_{128}$, as shown. The collector electrodes of transistors $33_1$–$33_{128}$ are coupled to the base electrodes of coupling Schottky transistors $35_1$–$35_{128}$, respectively as indicated. The collector electrodes of transistors $35_1$–$35_{128}$ are fed to a power source terminal 36 through resistors $37_1$–$37_{128}$, respectively, as indicated. As will be described hereinafter, during the program mode, the voltage at power source terminal 36 is relatively high, here $+10$ volts, whereas during the read mode the voltage at the power source terminal 36 is of a lower voltage, here approximately $V_{cc}$ (i.e., 5 volts). With such arrangement, during the program mode, i.e., with the higher voltage coupled to power source terminal 36, a larger current flows from such power source terminal 36 through the collector-emitter electrodes of a selected one of the coupling transistors $35_1$–$35_{128}$ to the base electrode of the one of a plurality of output transistors $38_1$–$38_{128}$ coupled to the emitter electrode of the selected one of the coupling transistors $35_1$–$35_{128}$. In this way the one of the output transistors $38_1$–$38_{128}$ coupled to the selected one of the coupling transistors $35_1$–$35_{128}$ operates at a relatively low forced beta during the program mode and is able to sink, when in saturation, both the current required to fuse a selected one of the fusible links 22 and the total reverse bias or leakage current flowing through the diodes 20 serially connected to the unselected fusible links. Completing the description of the row driver circuits $32_1$–$32_{128}$, the base electrodes of output transistor $38_1$–$38_{128}$ are coupled to ground through resistors $39_1$–$39_{128}$, respectively, as shown; the collector electrodes of coupling transistors $35_1$–$35_{128}$ are coupled to the collector electrodes of output transistors $38_1$–$38_{128}$, respectively as shown, through resistors $40_1$–$40_{128}$ and serially connected Schottky diodes $41_1$–$41_{128}$, respectively, as indicated. The collector electrodes of output transistors $38_1$–$38_{128}$ are connected to row conductors $14_1$–$14_{128}$, respectively as indicated; and the emitter electrodes of output transistors $31_1$–$38_{128}$ are connected to ground, respectively as shown.

The column conductors $16_{1a}$–$16_{16a}$ through $16_{1h}$–$16_{16h}$ are fed to Y decoders $50_a$–$50_h$, respectively as shown. Thus, considering section 13a of memory array 12, column conductors $16_{1a}$–$16_{16a}$ are fed to Y decoder $50a$ through the emitter electrodes of transistors $52_{1a}$–$52_{16a}$, respectively as indicated. To put it more generally, the column conductors of sections $13a$–$13h$ are coupled to Y decoders $50a$–$50h$ respectively through sets of transistors $52_{1a}$–$52_{16a}$ through $52_{1h}$–$52_{16h}$, respectively as indicated. Each one of the Y decoders $50a$–$50h$ is identical in construction and here is a conventional diode matrix fed by control signals supplied by Y address inverter section 54 and a $+V_{cc}$ supply, as indicated. The control signals produced by the Y address inverter section 54 (which is equivalent to the X address inverter section 30 discussed above) are true and complement signals of the logic signals fed to terminals $A_7$–$A_{10}$. That is, the logic signals $A_7$–$A_{10}$ fed to terminals $A_7$–$A_{10}$ supply four of the 11-bit address signals for the 2048 words stored in the PROM (the remaining 7 bits being fed to terminals $A_0$–$A_6$ as described above). Thus, the Y address inverter section 54 produces true signals $A_7'$–$A_{10}'$ and complement signals $\overline{A}_7'$–$\overline{A}_{10}'$, such signals providing the control signals for each one of the Y decoders $50a$–$50h$. Thus in response to logic signals fed to terminals $A_7$–$A_{10}$, base current flows from the $+V_{cc}$ source, to a selected one of the transistors $52_{1a}$–$52_{16a}$ coupled to the Y decoder $50a$, thereby selecting the one of the column conductors $16_{1a}$–$16_{16a}$ connected to the emitter electrode of the selected one of the transistors $52_{1a}$–$52_{16a}$. More generally, the control signals produced by Y address inverter section 54 select one of the column conductors in each one of the sections $13a$–$13h$ of the memory array 12. Transistors $52_{1a}$–$52_{16a}$ through transistors $52_{1h}$–$52_{16h}$ have collector electrodes connected together to teminals $57a$–$57h$, respectively as shown. Terminals $57a$–$57h$ are coupled to output buffers $58a$–$58h$, respectively as shown. Thus, in response to the control signals produced by Y address inverter section 54 of a selected one of the column conductors of each of the sections $13a$–$13h$ of memory array 12 is coupled to a corresponding one of the output buffers $58a$–$58h$, respectively as indicated. Each one of the output buffers $58a$–$58h$ is coupled to a corresponding one of output terminals $O_0$–$O_7$, respectively as shown. As will be described, during the program mode current fed to one of the output terminals $O_0$–$O_7$ passes through one of the fusible links 22 in the one of the sections $13a$–$13h$ of the memory array 12, such fusible link being selected by the address signals $A_0$–$A_{10}$; whereas during the read mode each one of the output terminals $O_0$–$O_7$ produces a logic signal representative of the eight bits of the one of the 2048 words stored in the PROM 10 and selected by the address signals $A_0$–$A_{10}$.

The PROM 10 includes a PROM program enable section 60. Such section 60 is coupled to a terminal $\overline{E}$, as shown. More particularly, terminal $\overline{E}$ is coupled to the base electrode of a P-N-P transistor 61 and to the anode of a zener diode 73 as shown. Here, zener diode 73 has a breakdown voltage of 7 volts. The cathode of zener diode 73 is connected to a terminal 75, as shown. The transistor 61 is a multiple emitter transistor having one emitter connected to the $+V_{cc}$ supply through a resistor 63 as shown and to the base electrode of Schottky transistor 64, through a Schottky diode 62, as shown. The other emitter of transistor 61 is directly connected to the base electrode of transistor 64, as shown. The emitter of transistor 64 is coupled to the base of the transistor 65 and to ground through resistor 66, as shown. The emitter of transistor 65 is connected to ground and the collector is connected to: the collector of transistor 64 through resistor 68 and the $+V_{cc}$ supply through resistor 69, and the base of transistor 67, as shown. The emitter of transistor 67 is connected through diode 107 to line E and to its collector through resistor 71, as shown.

When the signal fed to terminal $\overline{E}$ is a relatively high positive voltage, here +33 volts, the PROM 10 is placed in the program mode, and when the signal fed to terminal $\overline{E}$ is relatively low, here approximately +0.3 volts, the then programmed PROM 10 is placed in the read mode. More particularly, when the +33 volts is fed to terminal $\overline{E}$, transistor 61 is turned "off", placing transistors 64, 65 and 67 "on" so that the voltage on line E goes "low". Also such +33 volts causes zener diode 73 to break down, producing a +25 volt potential at terminal 75. Terminal 75 is fed to an X decoder power switch 70. Such switch 70 includes a voltage divider network made up of resistors 74, 76, zener diode 78, transistors 80, 82 and resistor 84, connected as shown to produce, in response to the +25 volt potential at terminal 75, a voltage at power source terminal 36 greater than $+V_{cc}$; here such switch 70 produces a voltage of +10 volts at terminal 36 in response to the +25 volts at terminal 75 (i.e., switch 70 produces +10 volts at power source terminal 36 when a program enable signal (i.e., +33 volts) is fed to terminal $\overline{E}$). Conversely, when in the read mode (i.e., when the voltage at terminal $\overline{E}$ is low) the zener diode 73 does not break down and terminal 75 is open so that the $+V_{cc}$ source is coupled to power source terminal 36 through Schottky diode 83, as shown. Therefore, during the program mode, the output transistors $38_1$–$38_{128}$ of X decoder section 24 are supplied a greater base current from the +10 volts at terminal 36 than during the read mode when approximately 5 volts is fed to terminal 36. The reason for changing the voltage at terminal 36, and hence the base current to output transistors $38_1$–$38_{128}$ depending on whether the PROM 10 is in the read or program mode, will be discussed in further detail later. Suffice it to say here, however, that by supplying the higher voltage to the row, or X, driver circuits $32_1$–$32_{128}$ during the program mode will decrease the forced beta of the output transistors $38_1$–$38_{128}$, allowing such output transistors $38_1$–$38_{128}$ to sink not only the current required to blow a selected one of the fusible links 22 but also to sink leakage current passing to output transistors from diodes 20 connected to unselected fusible links.

Each one of the output buffers 58a–58h is identical in construction, buffer memory 58a being shown in detail to include transistors 96, 98, 99, 100 and 102, as shown. The base electrode of transistor 96 is coupled to line E through Schottky diode 90 and diode 92 and to terminal 57a through resistor 104 and Schottky diode 106. The junction 105 of resistor 104 and Schottky diode 106 is coupled to a $+V_{cc}$ through resistor 108 and to the collector of transistor 96 through a Schottky diode 110, as shown. The collector of transistor 96 is connected to $+V_{cc}$ through resistor 112 and to the base of transistor 98 through resistor 114 and Schottky diode 116. The base of transistor 98 is connected to its emitter through resistor 118 and its emitter is connected: to ground through resistor 120; to the collector of transistor 99 through a resistor 134; to the base of transistor 99 through a resistor 122; and to the base of transistor 107, as shown. The collector of transistor 98 is connected to line E through Schottky diode 94, to $+V_{cc}$ through resistor 124, and to the base of transistor 102, as shown. The collector of transistor 102 is connected to $+V_{cc}$ through resistor 126 and the emitter is connected to terminal $O_0$ and to the collectors of transistors 128, 130 through a Schottky diode 132 as shown. Terminal $O_0$ is connected to the collector of transistor 107. The emitter of transistor 107 is grounded and the base is connected to the emitter of transistor 98. The emitter of transistor 99 is connected to ground as shown. Terminal 75 of the PROM program enable section 60 is coupled to the base electrode of transistor 130 through a resistor 136. The base electrode of transistor 130 is connected to the base of transistor 138. The emitter of transistor 138 is connected to the emitter of transistor 130 and the base of transistor 128, as shown. The collector of transistor 138 is grounded. The transistors 128, 130 form a Darlington pair, the emitter of transistor 128 being connected to terminal 57a, as shown.

Continuing in the operation of the PROM 10, then, during the program mode line E is low for reasons set forth above. In response to the low voltage on line E diodes 90, 92, and 94 are forward biased placing transistors 96, 98, 99, 100 and 102 in an "off" or non-conducting condition. Further, diode 106 is reverse biased. Thus, when it is desired to program the memory elements 18 in section 13a of the memory array 12, a power supply (not shown) is connected to the output terminal $O_0$ and current flows from such supply through the collector electrodes of Darlington connected transistors 130, 128 (such transistors being biased "on" by the high +25 volts at terminal 75) to the collector electrode and emitter electrode of the one of the transistors $52_{1a}$–$52_{16a}$ selected by the signals on lines $A_7$–$A_{10}$, through the one of the column conductors $16_{1a}$–$16_{16a}$ connected to such selected one of the transistors $52_{1a}$–$52_{16a}$ through the one of the fusible links 22 connected between such selected one of the column conductors $16_{1a}$–$16_{16a}$ and one of the row conductors $14_1$–$14_{128}$ selected by the signals at terminals $A_0$–$A_6$. Thus, current flows through such selected one of the fusible links 22 connected to the one of the selected row conductors $14_1$–$14_{128}$ to ground through the collector-emitter electrode of one of the output transistors $38_1$–$38_{128}$ connected to such selected one of the row conductors $14_1$–$14_{128}$. For example, consider the signals on lines $A_0$–$A_6$ as 0000000: high signals are produced on each of the seven emitter electrodes of transistor $33_1$, causing current to flow through resistor $34_1$ and the collector of transistor $33_1$ to turn "on" transistors $35_1$ and $38_1$, while transistors $33_2$–$33_{128}$ have at least one of their emitters at a low voltage so that transistors $38_2$–$38_{128}$ are hence "off" or non-conducting. If follows that the voltage on line $14_1$ is "low" and the voltage on lines $14_2$–$14_{128}$ are "high" (i.e., about 10 volts). Consider also that the signals on lines $A_7$–$A_{10}$ enable Y decoder 50a to turn on transistor $52_{1a}$, thus selecting memory element 18a (i.e., the memory element connected between row conductor $14_1$ and column conductor $16_{1a}$). Current passes from the source (not shown) connected to terminal $O_0$ through the fusible link 22 of memory element 18a of sufficient level to blow such link 22. The path of this current is shown by the solid arrow 150. It is noted that transistor $38_1$ not only must sink this current, typically 25 ma, but must also sink leakage current, indicated by the dotted arrows 152, passing through the reverse biased diodes 20 of the unselected memory elements 18. While each diode has only about 1.5 microamperes reverse bias current, here there are in excess of 15,000 such diodes so that the total leakage current which must pass through transistor $38_1$ is 24 ma. It is noted that such transistor $38_1$ is able to sink this large amount of current because it has a lower forced beta as a result of a relatively large base current supplied from a higher, here +10 volt, supply produced at terminal 36 by the X decoder power supply switch 70.

After the section 13a of the memory array 12 is programmed, sections 13b–13h become sequentially programmed in like manner by connecting the supply (not shown) previously coupled to terminal $O_0$ sequentially to terminals $O_1$–$O_7$ respectively.

During the read mode, a low voltage, here +0.3 volts, is fed to terminal $\bar{E}$. In response to such low voltage signal the X decoder power supply switch 70 couples the $+V_{cc}$ supply to terminal 36, such $+V_{cc}$ supply now providing the source for the row, or X, driver circuits $32_1$–$32_{128}$. Word address signals are fed to terminals $A_0$–$A_{11}$, thereby selecting one of the row conductors $14_1$–$14_{128}$ as described for the program mode and one of the column conductors in each one of the sections 13a–13h, respectively. It is noted that in response to the low voltage on terminal $\bar{E}$ transistor 61 turns "on" and transistors 64 and 65 turn "off" placing a "high" voltage (i.e., $V_{cc}$) on line E reverse biasing diodes 90, 92 and 94. Thus, for example, if the fusible link 22 of memory element 18a had not been blown and such memory element 18a is now selected during the subsequent read mode, the low voltage on line $14_1$ resulting from transistor $38_1$ being turned "on", would be coupled to column conductor $16_{1a}$ and to the collector of transistor $52_{1a}$ to terminal 57a and to the base of transistor 96 through forward biased diode 106. This low voltage at the base of transistor 96 places transistor 100 in an "off" state so that the voltage at terminal $O_0$ is $V_{cc}$ or high, indicating that (unblown) memory element 18a represents or stores a logical 1 signal. (It is noted that, during the read mode, the voltage at terminal 75 is "open" and, hence, transistors 128, 130 are disabled.) If, on the other hand, the fusible link 22 of memory element 18a had been blown (i.e., was open circuit), then, during the subsequent read mode the voltage at the base of transistor 96 would be high from $V_{cc}$, resistors 108, diode 116, resistor 114, resistor 118, and resistor 120, turning transistor 96 and transistors 98, 99 and 100 to conduction so that the voltage at terminal $O_0$ would be "low," indicating that (blown) memory element 18a represents or stores a logical 0. Output buffers 58b–58h operate simultaneously in like manner, thereby enabling the PROM to read the 8-bit contents of the word stored at the location addressed by the signals on lines $A_0$–$A_{11}$.

Having described a preferred embodiment of this invention, it is now evident that other embodiments incorporating its concepts may be used. It is felt, therefore, that this invention should not be restricted to such preferred embodiment but rather should be limited only the spirit and scope of the appended claims.

What is claimed is:

1. A programmable read-only memory circuit comprising:
(a) a memory array comprising a plurality of addressable programmable memory elements;
(b) address circuitry for addressing the programmable memory elements of the memory array, such address circuitry having a plurality of output transistors coupled to different ones of the programmable memory elements and including means for driving a selected one of the output transistors into saturation to address a portion of the array; and
(c) means including a program enable circuit responsive to a program enable signal and a read mode signal for supplying a first level of base electrode current to said selected, saturated output transistor during a program mode and a second, different level of base electrode current to said selected, saturated output transistor during a read mode.

2. The circuit recited in claim 1 wherein such one of the addressable programmable memory elements includes a diode and a serially connected fusible link.

3. The circuit recited in claim 2 wherein each one of the output transistors has its emitter and collector electrodes serially coupled to a corresponding row of the fusible links.

4. A programmable read-only memory circuit comprising:
(a) a memory array comprising a plurality of addressable memory elements arranged in a matrix of rows and columns, each one of such elements including a fusible link and a serially connected diode;
(b) address circuitry for addressing the memory elements, such address circuitry having a plurality of output transistors each one having a collector electrode coupled to a different one of the rows of programmable memory elements including means for driving a selected one of the output transistors into saturation to address a portion of the array;
(c) means including a program enable circuit responsive to a program enable signal and a read mode signal for supplying a first level of base electrode current to said selected, saturated output transistor during a program mode and a second, lower level of base electrode current to said selected, saturated output transistor during a read mode.

5. A programmable read-only memory circuit comprising:
(a) a memory array comprising a plurality of addressable programmable memory elements arranged in a matrix of rows and columns;
(b) address circuitry for addressing one of the programmable memory elements of the memory array selectively in response to row and column adessing signals, such addressing circuitry having a first plurality of output transistors for addressing the elements in the rows of the array and a second plurality of output transistors for addressing the elements in the columns of the array;
(c) output circuitry coupled between the second one of the plurality of output transistors and an output terminal for coupling a source of programming current fed to the output terminal through one of the second plurality of output transistors to the one of the memory elements selected in accordance with the row and column addressing signals during a program mode to program such selected element and for coupling a signal indicative of a logic state represented by one of the programmed memory elements selected in accordance with the row and column addressing signals through one of the selected one of the second plurality of output transistors to said output terminal during a read mode; and
(d) means including a program enable circuit responsive to a program enable signal and a read mode signal for supplying a first level of current to a base electrode of one of the first plurality of output transistors selected in accordance with row addressing signals during the program mode and a second, different level of current to the base electrode of one of the first plurality of output transistors selected in accordance with the row addressing signals during the read mode.

6. A programmable read-only memory comprising:
(a) a memory array comprising a plurality of addressable programmable memory elements arranged in a matrix of rows and columns, each one of such memory elements including a fusible link and a serially connected diode;

(b) addressing circuitry for addressing a selected one of the programmable memory elements of the memory array, such one of the programmable memory elements being selected in accordance with row and column addressing signals, such addressing circuitry having a plurality of output transistors coupled to different ones of the rows of the programmable memory elements and means for driving a selected one of such output transistors into saturation to address one of the rows of elements;

(c) means including a program enable circuit responsive to a program enable signal and a read mode signal for supplying a first level of base electrode current to the selected saturated one of the output transistors during a program mode and a second, lower level of current to the base electrode of the selected saturated one of the output transistors during a read mode, such first level of current decreasing the forced beta of the selected saturated one of the output transistors during the program mode to allow such selected saturated one of the output transistors to pass therethrough current required to open the fusible link of the selected one of the memory elements and, additionally, leakage current passing through reverse biased diodes of other ones of the memory elements.

* * * * *